(12) United States Patent
Kudo

(10) Patent No.: US 6,329,862 B1
(45) Date of Patent: Dec. 11, 2001

(54) REFERENCE FREQUENCY SIGNAL SWITCHING CIRCUIT CAPABLE OF ADJUSTING LEVEL OF EXTERNAL REFERENCE FREQUENCY SIGNAL AND OUTPUTTING RESULTANT SIGNAL

(75) Inventor: Yasuharu Kudo, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/595,710

(22) Filed: Jun. 16, 2000

(30) Foreign Application Priority Data

Jun. 17, 1999 (JP) .................................................. 11-171344

(51) Int. Cl.[7] .................................................. H03K 17/00
(52) U.S. Cl. .................................. 327/298; 327/99; 331/18
(58) Field of Search .............................. 327/99, 141, 144, 327/145, 293, 294, 298; 331/18, 49

(56) References Cited

U.S. PATENT DOCUMENTS

| 5,081,705 | * | 1/1992 | Swanke | 331/18 |
| 5,369,377 | * | 11/1994 | Benhamida | 331/49 |
| 5,373,254 | * | 12/1994 | Nakauch et al. | 331/18 |
| 5,587,675 | * | 12/1996 | Schmitt | 327/99 |
| 5,844,435 | * | 12/1998 | Grundvig | 327/99 |
| 5,929,713 | * | 7/1999 | Kubo et al. | 327/298 |
| 5,982,241 | * | 11/1999 | Nguyen et al. | 331/49 |

FOREIGN PATENT DOCUMENTS

Hei 8-149000    6/1996    (JP) .

* cited by examiner

Primary Examiner—Kenneth B. Wells
Assistant Examiner—Paul Dinh
(74) Attorney, Agent, or Firm—Brinks Hofer Gilson & Lione

(57) ABSTRACT

A reference frequency signal switching circuit of the invention comprises: a internal oscillator for generating an internal reference frequency signal; an external reference frequency signal input terminal to which an external reference frequency signal is supplied; and a signal switching circuit for selectively outputting the internal reference frequency signal and the external reference frequency signal. Since an output level adjusting circuit for setting the external reference frequency signal outputted to a reference frequency signal output terminal so as to be at a predetermined level is provided, the output level can be made constant.

4 Claims, 4 Drawing Sheets

REFERENCE FREQUENCY SIGNAL SWITCHING CIRCUIT CAPABLE OF ADJUSTING LEVEL OF EXTERNAL REFERENCE FREQUENCY SIGNAL AND OUTPUTTING RESULTANT SIGNAL

BACKGROUND OF THE INVENTION

1. Field of the Invention

The present invention relates to a reference frequency signal switching circuit and, more particularly, to a reference frequency signal switching circuit capable of selectively outputting an internal reference frequency signal generated by an internal oscillator or an external reference frequency signal supplied from the outside and maintaining the output at a constant level irrespective of the level of the external reference frequency signal supplied.

2. Description of the Related Art

Hitherto, in transmitter of a cable television (CATV), a reference frequency signal switching circuit for supplying a reference frequency signal to operate the transmitter is used.

The reference frequency signal switching circuit has therein an internal oscillator for generating an internal reference frequency signal and operates so as to selectively output an internal reference frequency signal outputted from the internal oscillator or an external reference frequency signal supplied from the outside. In the case of operating a single transmitter, the internal reference frequency signal outputted from the internal oscillator is used. In the case of using a plurality of transmitters in the same system, in order to operate the transmitters at the same frequency, the external reference frequency signal supplied from the outside is used.

FIG. 5 is a diagram showing an example of the construction of a conventional reference frequency signal switching circuit.

As shown in FIG. 5, the conventional reference frequency signal switching circuit comprises: an external reference frequency signal input terminal 31 to which the external reference frequency signal is supplied; an input circuit 32; an internal oscillator 33 for generating an internal reference frequency signal; a buffer amplifier 34; a signal switching circuit 35; a reference frequency signal output terminal 36; a high voltage power source terminal 37; and a low voltage power source terminal 38. The signal switching circuit 35 has a tuned amplifier $35_1$ a detecting circuit $35_2$, a smoothing circuit $35_3$, a first switching transistor $35_4$, a second switching transistor $35_5$, a first switching diode $35_6$, a second switching diode $35_7$, a coupling capacitor $35_8$, a collector resistor $35_9$, an inductor $35_{10}$ and a bias resistor $35_{11}$.

The external reference frequency signal supplied to the external reference frequency signal input terminal 31 passes through the input circuit 32 and is supplied to the tuned amplifier $35_1$ and the first switching diode $35_6$ in the signal switching circuit 35.

On the other hand, the internal reference frequency signal outputted from the internal oscillator 33 passes through the buffer amplifier 34 and is supplied to the second switching diode $35_7$ in the signal switching circuit 35. Either the external reference frequency signal supplied to the first switching diode $35_6$ or the internal reference frequency signal supplied to the second switching diode $35_7$ is outputted via the coupling capacitor $35_8$ to the reference frequency signal output terminal 36.

A voltage of 5V is supplied from the high voltage power source terminal 37 to the tuned amplifier $35_1$ and is supplied to the collector of the first switching transistor $35_4$ via the collector resistor $35_9$. A voltage of 3V is supplied from the low voltage power source terminal 38 to the internal oscillator 33, the buffer amplifier 34 and the anode of the first switching diode $35_6$ The cathode of the second switching diode $35_7$ is connected to the ground via the bias resistor $35_{11}$.

The detecting circuit $35_2$ is connected to the tuned amplifier $35_1$ the smoothing circuit $35_3$ is connected to the detecting circuit $35_2$, and the base of the first switching transistor $35_4$ is connected to the smoothing circuit $35_3$. The collector of the first switching transistor $35_4$ is connected to the base of the second switching transistor $35_5$ via a resistor and is also connected via the inductor $35_{10}$ to the cathode of the first switching diode $35_6$ and the anode of the second switching diode $35_7$.

The internal oscillator 33 and the buffer amplifier 34 are connected to the ground via the second switching transistor $35_5$ which operates as a switch of the internal oscillator 33 and the buffer amplifier 34.

The operation of the conventional reference frequency signal switching circuit will be described as follows.

When the external reference frequency signal is not supplied to the external reference frequency signal input terminal 31, since the external reference frequency signal is not outputted from the tuned amplifier $35_1$ a DC voltage is not outputted from the detecting circuit $35_2$ and, therefore, a detection voltage is not outputted from the smoothing circuit $35_3$. Consequently, the first switching transistor $35_4$ is turned off. When the first switching transistor $35_4$ is turned off, the high voltage (5V) supplied to the high voltage power source terminal 37 is supplied via the collector resistor $35_9$ to the base of the second switching transistor $35_5$. Then the second switching transistor $35_5$ is turned on and the internal oscillator 33 and the buffer amplifier 34 are connected to the ground via the second switching transistor $35_5$. The voltage (3V) is supplied from the low voltage power source terminal to the internal oscillator 33 and the buffer amplifier 34, the internal oscillator 33 outputs the internal reference frequency signal, and the buffer amplifier 34 amplifies the signal. At this time, the signal is supplied via the collector resistor $35_9$ and the inductor $35_{10}$ to both the cathode of the first switching diode $35_6$ and the anode of the second switching diode $35_7$, so that the second switching diode $35_7$ is turned on. The internal reference frequency signal amplified by the buffer amplifier 34 is outputted from the reference frequency signal output terminal 36 via the second switching diode $35_7$ and the coupling capacitor $35_8$ On the other hand, the first switching diode $35_6$ enters an OFF state, so that the internal reference frequency signal appearing at the anode side of the second switching diode $35_7$ is not leaked to the external reference frequency signal terminal 31.

When the external reference frequency signal is supplied to the external reference frequency signal input terminal 31, the external reference frequency signal is amplified by the tuned amplifier $35_1$ detected by the detecting circuit $35_2$ smoothed by the smoothing circuit $35_3$, and a resultant is supplied as a detection voltage to the base of the first transistor $35_4$, thereby turning on the first switching transistor $35_4$. Then the collector of the first switching transistor $35_4$ approaches ground. Accordingly, the base of the second switching transistor $35_5$, the cathode of the first switching diode $35_6$ and the anode of the second switching diode $35_7$ approaches ground. The second switching transistor $35_5$ is therefore turned off and the voltage (3V) is not supplied from the low voltage power source terminal 38 to the internal oscillator 33 and the buffer amplifier 34. The internal oscillator 33 stops outputting the internal reference frequency signal and the buffer amplifier 34 also stops outputting the signal. The second switching diode 35$_7$ is turned off, so that the internal oscillator 33 and the buffer amplifier 34 are isolated from the reference frequency signal output terminal 36. On the other hand, the low voltage (3V) supplied from the low voltage power source terminal 38 is supplied to the anode of the first switching diode 35$_6$ and the cathode approaches ground. Consequently, a forward bias is applied and the first switching diode 35$_6$ is turned on. The external reference frequency signal supplied to the external reference frequency signal input terminal 31 is outputted to the reference frequency signal output terminal 36.

As described above, according to the conventional reference frequency signal switching circuit, when the external reference frequency signal is not supplied to the external reference frequency signal input terminal 31, the internal reference frequency signal generated by the internal oscillator 33 is outputted. When the external reference frequency signal is supplied to the external reference frequency signal input terminal, the supplied external reference frequency signal is outputted as it is. In such a manner, the outputs of the reference frequency signals are automatically switched.

In the conventional reference frequency signal switching circuit, however, the supplied external reference frequency signal is outputted at the level corresponding to the inputted level. When the level of the external reference frequency signal fluctuates, the level of the reference frequency signal supplied from the reference frequency signal switching circuit to the transmitter also fluctuates, and a problem such that the transmitter does not operate normally occurs.

SUMMARY OF THE INVENTION

The invention is to solve the problems and its object is to provide a reference frequency signal switching circuit capable of selectively outputting either the external reference frequency signal or the internal reference frequency signal and, in the case of outputting the external reference frequency signal, outputting the signal at a preset level irrespective of the level of a supplied external reference frequency signal.

In order to achieve the object, a reference frequency signal switching circuit of the invention comprises: an internal oscillator for generating an internal reference frequency signal; an external reference frequency signal input terminal to which an external reference frequency signal is supplied; a signal switching circuit; an output level adjusting circuit; and a reference frequency signal output terminal from which the internal reference frequency signal and the external reference frequency signal are outputted. When the external reference frequency is not supplied, the signal switching circuit outputs the internal reference frequency signal from the internal reference frequency oscillator to the output level adjusting circuit. When the external reference frequency is supplied, the signal switching circuit outputs the external reference frequency signal to the output level adjusting circuit, and the output level adjusting circuit adjusts the output level of the external reference frequency signal to be outputted to the reference frequency signal output terminal to be constant irrespective of the level of an input.

The output level adjusting circuit in the reference frequency signal switching circuit of the invention can change the output level.

The output level adjusting circuit in the reference frequency signal switching circuit of the invention has a PIN diode and a differential amplifier, the PIN diode is connected in series between the signal switching circuit and the reference frequency signal output terminal, a reference voltage is supplied to one of input terminals of the differential amplifier, a detection voltage proportional to the level of the external reference frequency signal is supplied to the other input terminal, an output terminal of the differential amplifier is connected to one end of the PIN diode, the magnitude of a current passing through the PIN diode is changed by an output voltage of the differential amplifier, and the output level is changed according to the reference voltage.

The output level adjusting circuit in the reference frequency signal switching circuit of the invention has a PIN diode and a differential amplifier, the PIN diode is connected between a transfer line which connects the signal switching circuit and the reference frequency signal output terminal and the ground, a reference voltage is supplied to one of input terminals of the differential amplifier, a detection voltage proportional to the level of the external reference frequency signal is supplied to the other input terminal, an output terminal of the differential amplifier is connected to one end of the PIN diode, the magnitude of a current passing through the PIN diode is changed according to an output voltage of the differential amplifier, and the output level is changed according to the reference voltage.

The output level adjusting circuit in the reference frequency signal switching circuit of the invention has a PIN diode and a differential amplifier, the PIN diode is connected in series between the signal switching circuit and the reference frequency signal output terminal, the reference voltage is supplied to a non-inversion input terminal of the differential amplifier, the detection voltage is supplied to an inversion input terminal, an output terminal of the differential amplifier is connected to one end of the PIN diode, and the magnitude of a current passing through the PIN diode is changed according to an output voltage of the differential amplifier.

The output level adjusting circuit in the reference frequency signal switching circuit of the invention has a PIN diode and a differential amplifier, the PIN diode is connected between a transfer line which connects the signal switching circuit and the reference frequency signal output terminal and the ground, the reference voltage is supplied to an inversion input terminal of the differential amplifier, the detection voltage is supplied to a non-inversion input terminal, an output terminal of the differential amplifier is connected to one end of the PIN diode, and the magnitude of a current passing through the PIN diode is changed according to an output voltage of the differential amplifier.

DETAILED DESCRIPTION OF THE PREFERRED EMBODIMENTS

Figure 1:
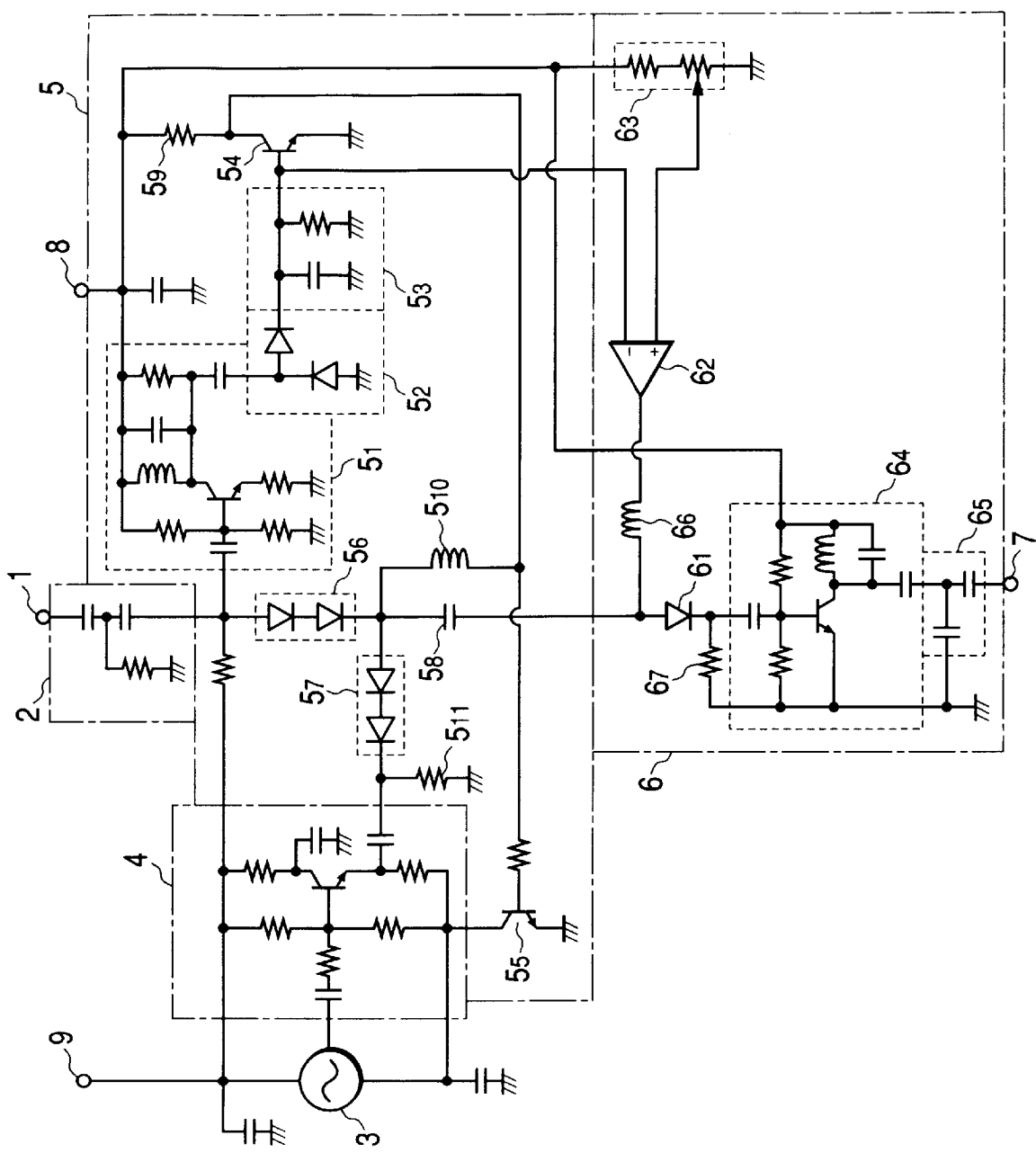
FIG. 1 is a block diagram of a reference frequency signal switching circuit of the invention.
Figure 2:
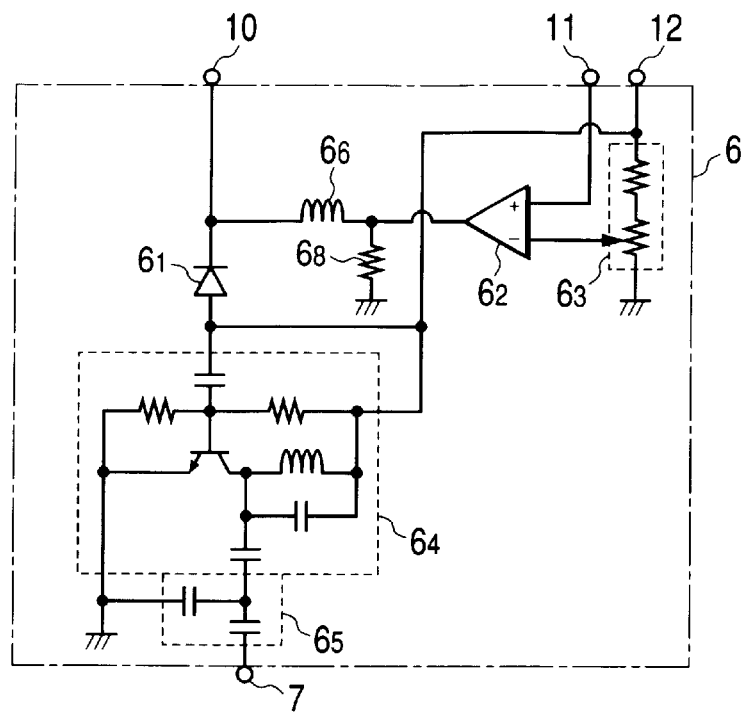
FIG. 2 is a block diagram showing another embodiment of an output level adjusting circuit of the reference frequency signal switching circuit of the invention.
Figure 3:
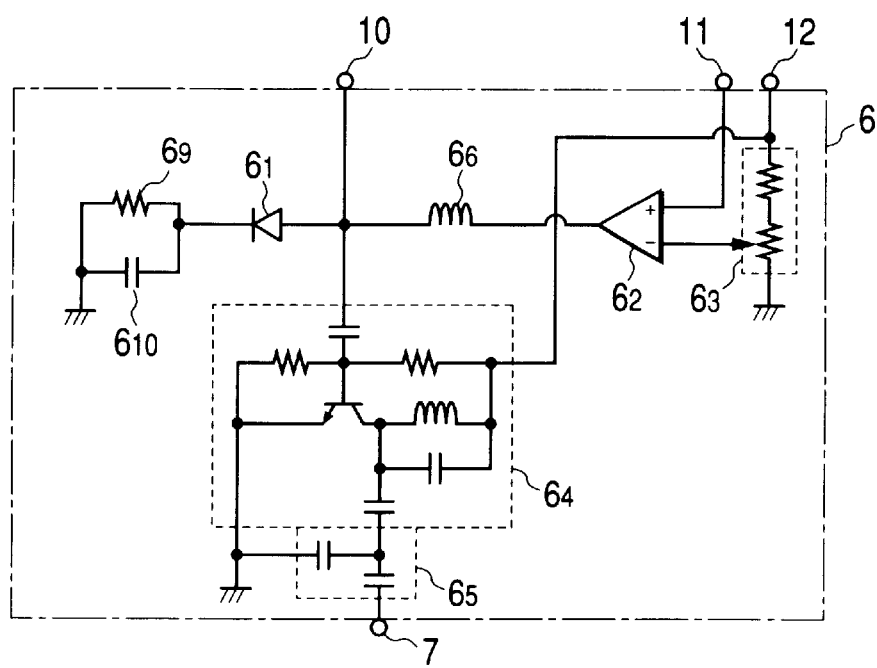
FIG. 3 is a block diagram showing further another embodiment of the output level adjusting circuit of the reference frequency signal switching circuit of the invention.
Figure 4:
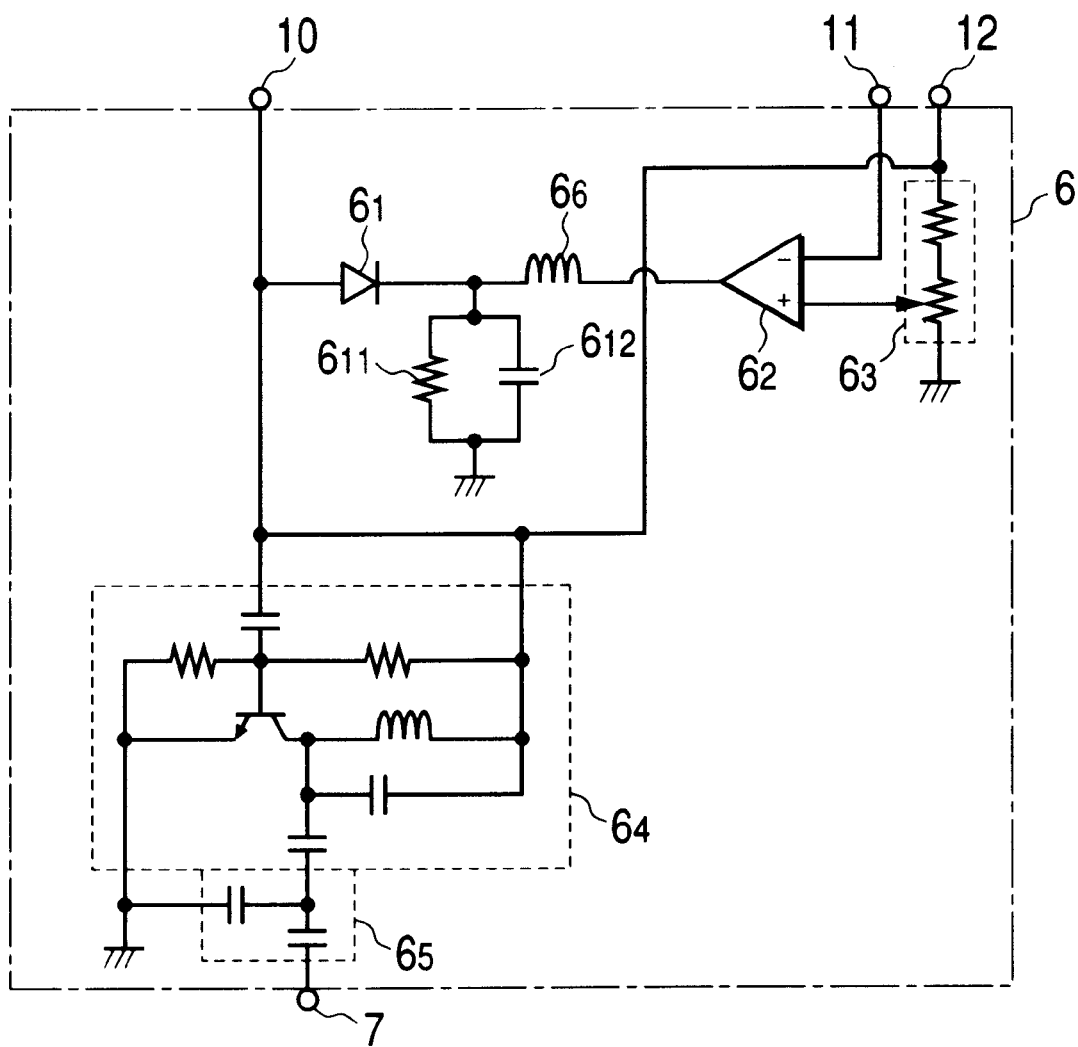
FIG. 4 is a block diagram showing further another embodiment of the output level adjusting circuit of the reference frequency signal switching circuit of the invention.
Figure 5:
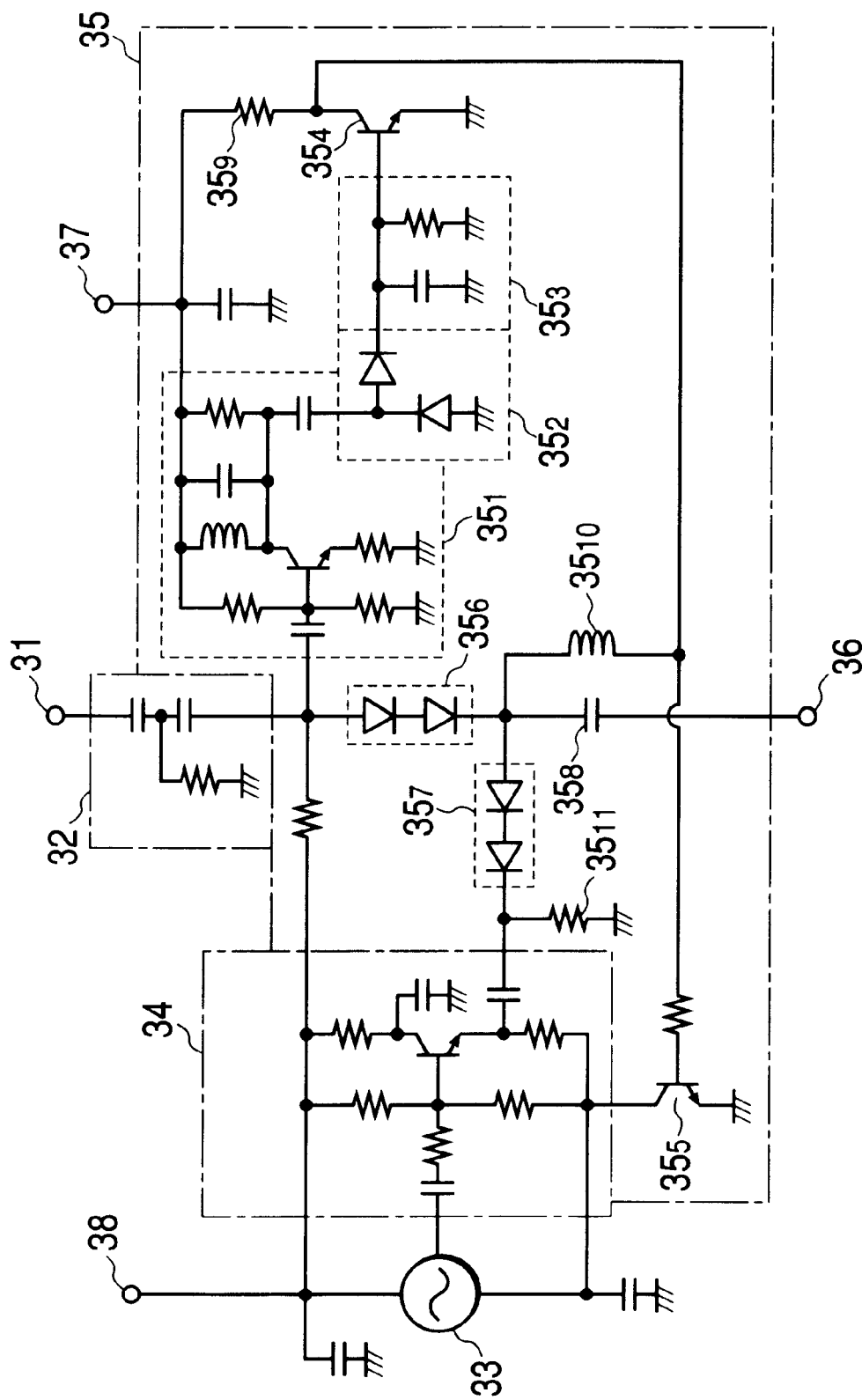
FIG. 5 is a block diagram of a conventional reference frequency signal switching circuit.

A reference frequency signal switching circuit of the invention will be described with reference to FIGS. 1 to 4. FIG. 1 is a block diagram showing a first embodiment of a reference frequency signal switching circuit of the invention. FIG. 2 is a block diagram showing an output level adjusting circuit in another embodiment of the reference frequency signal switching circuit of the invention. FIG. 3 is a block diagram showing the output level adjusting circuit in further another embodiment of the reference frequency signal switching circuit of the invention. FIG. 4 is a block diagram showing the output level adjusting circuit in further another embodiment of the reference frequency signal switching circuit of the invention.

First, in FIG. 1, the reference frequency signal switching circuit of the invention comprises an external reference frequency signal input terminal 1, an input circuit 2, an internal oscillator 3 for generating an internal reference frequency signal, a buffer amplifier 4, a signal switching circuit 5, an output level adjusting circuit 6, a reference frequency signal output terminal 7, a high voltage power source terminal 8, and a low voltage power source terminal 9. The signal switching circuit 5 has a tuned amplifier $5_1$, a detecting circuit $5_2$, a smoothing circuit $5_3$, a first switching transistor $5_4$, a second switching transistor $5_5$, a first switching diode $5_6$, a second switching diode $5_7$, a coupling capacitor $5_8$, a collector resistor $5_9$, an inductor $5_{10}$ and a bias resistor $5_{11}$. The output level adjusting circuit 6 has a PIN diode $6_1$, a differential amplifier $6_2$, a reference voltage adjusting circuit $6_3$, an output tuned amplifier $6_4$, an output circuit $6_5$, an inductor $6_6$, and a bias resistor $6_7$.

The external reference frequency signal supplied to the external reference frequency signal input terminal 1 passes through the input circuit 2 and is supplied to the tuned amplifier $5_1$ and the first switching diode $5_6$ in the signal switching circuit 5.

On the other hand, the internal reference frequency signal outputted from the internal oscillator 3 passes through the buffer amplifier 4 and is supplied to the second switching diode $5_7$ in the signal switching circuit 5. Either the external reference frequency signal supplied to the first switching diode $5_6$ or the internal reference frequency signal supplied to the second switching diode $5_7$ is supplied to the output level adjusting circuit 6 via the coupling capacitor $5_8$. Either the external reference frequency signal or the internal reference frequency signal supplied to the output level adjusting circuit 6 is adjusted to a predetermined level by the PIN diode $6_1$ and the output tuned amplifier $6_4$ and the resultant signal is outputted via the output circuit $6_5$ from the reference frequency signal output terminal 7.

A voltage of 5V is supplied from the high voltage power source terminal 8 via the collector resistor $5_9$ to the collector of the first switching transistor $5_4$ and is also supplied to the tuned amplifier $5_1$, the reference voltage adjusting circuit $6_3$ and the output tuned amplifier $6_4$. A voltage of 3V is supplied from the low voltage power source terminal 9 to the internal oscillator 3, the buffer amplifier 4 and the anode of the first switching diode $5_6$. The cathode of the second switching diode $5_7$ is connected to the ground via the bias resistor $5_{11}$.

The detecting circuit $5_2$ is connected to the tuned amplifier $5_1$ the smoothing circuit $5_3$ is connected to the detecting circuit $5_2$ and the base of the first switching transistor $5_4$ is connected to the smoothing circuit $5_3$. The collector of the first switching transistor $5_4$ is connected to the base of the second switching transistor $5_5$ via a resistor and is also connected via the inductor $5_{10}$ to the cathode of the first switching diode $5_6$ and the anode of the second switching diode $5_7$.

The internal oscillator 3 and the buffer amplifier 4 are connected to the ground via the second switching transistor $5_5$ which operates as a switch of the internal oscillator 3 and the buffer amplifier 4.

The reference voltage adjusting circuit $6_3$ in the output level adjusting circuit 6 takes the form of a voltage dividing circuit as a resistor provided between the high voltage power source terminal 8 and the ground. A divided voltage is supplied as a reference voltage to a non-inversion input terminal (+terminal) of the differential amplifier $6_2$. On the other hand, an inversion input terminal (−terminal) of the differential amplifier $6_2$ is connected to the smoothing circuit $5_3$ in the signal switching circuit 5 and a detection voltage is supplied. An output terminal of the differential amplifier $6_2$ is connected via the inductor $6_6$ to the anode of the PIN diode $6_1$ and the signal switching circuit 5 is also connected to the anode. The cathode of the PIN diode $6_1$ is connected to the ground via the bias resistor $6_7$ and is also connected to the output tuned amplifier $6_4$. The output tuned amplifier $6_4$ is connected to the reference frequency signal output terminal 7 via the output circuit $6_5$.

The operation of the reference frequency signal switching circuit of the invention will be described as follows.

When the external reference frequency signal is not supplied to the external reference frequency signal input terminal 1, the external reference frequency signal is not outputted from the tuned amplifier $5_1$ a DC voltage is not outputted from the detecting circuit $5_2$ and, therefore, a detection voltage is not outputted from the smoothing circuit $5_3$. Consequently, the first switching transistor $5_4$ is turned off. When the first switching transistor $5_4$ is turned off, the high voltage (5V) supplied to the high voltage power source terminal 8 is supplied via the collector resistor $5_9$ to the base of the second switching transistor $5_5$. Then the second switching transistor $5_5$ is turned on and the internal oscillator 3 and the buffer amplifier 4 are connected to the ground via the second switching transistor $5_5$. The voltage (3V) is supplied from the low voltage power source terminal to the internal oscillator 3 and the buffer amplifier 4, the internal oscillator 3 outputs the internal reference frequency signal, and the buffer amplifier 4 amplifies the signal. At this time, since the signal is also supplied via the collector resistor $5_9$ and the inductor $5_{10}$ to both the cathode of the first switching diode $5_6$ and the anode of the second switching diode $5_7$, the second switching diode $5_7$ is turned on. The internal reference frequency signal amplified by the buffer amplifier 4 is supplied to the output level adjusting circuit 6 via the second switching diode $5_7$ and the coupling capacitor $5_8$. On the other hand, the first switching diode $5_6$ enters an OFF state, so that the internal reference frequency signal appearing at the cathode side of the first switching diode is not leaked to the external reference frequency signal input terminal 1.

At this time, in the output level adjusting circuit 6, since the detection voltage is not outputted from the smoothing circuit $5_3$, the level of the inversion input terminal of the differential amplifier $6_2$ is lowered, a high voltage is supplied from the differential amplifier $6_2$ to the anode of the PIN diode $6_1$, and a current passing through the PIN diode $6_1$ increases. Consequently, an attenuation amount of the PIN diode $6_1$ becomes very small. The internal reference frequency signal which has passed through the PIN diode $6_1$ is amplified by the output tuned amplifier $6_4$ and is outputted from the reference frequency signal output terminal 7 via the output circuit $6_5$.

The internal reference frequency signal is therefore hardly attenuated by the signal switching circuit 5 and the PIN diode $6_1$, but is amplified by the output tuned amplifier $6_4$ and outputted.

When the external reference frequency signal is supplied to the external reference frequency signal input terminal 1, the external reference frequency signal is amplified by the tuned amplifier $5_1$, detected by the detecting circuit $5_2$, smoothed by the smoothing circuit $5_3$, and a resultant is supplied as a detection voltage proportional to the level of the external reference frequency signal to the base of the first switching transistor $5_4$, thereby turning on the first switching transistor $5_4$. Then the collector of the first switching transistor $5_4$ approaches ground. Accordingly, the base of the second switching transistor $5_5$, the cathode of the first switching diode $5_6$ and the anode of the second switching diode $5_7$ approaches ground. The second switching transistor $5_5$ is therefore turned off and the voltage (3V) is not supplied from the low voltage power source terminal 9 to the internal oscillator 3 and the buffer amplifier 4, so that the internal oscillator 3 stops outputting the internal reference frequency signal and the buffer amplifier 4 also stops outputting the signal. The second switching diode $5_7$ is turned off to thereby isolate the internal oscillator 3 and the buffer amplifier 4 from the output level adjusting circuit 6. On the other hand, the low voltage (3V) supplied from the low voltage power source terminal 9 is supplied to the anode of the first switching diode $5_6$ and the cathode comes to have an almost earth voltage. Consequently, a forward bias is applied, the first switching diode $5_6$ is turned on, and the external reference frequency signal supplied to the external reference frequency signal input terminal 1 is outputted to the output level adjusting circuit 6.

At this time, in the output level adjusting circuit 6, the detection voltage outputted from the smoothing circuit $5_3$ is supplied to the inversion input terminal of the differential amplifier $6_2$. Consequently, as the level of the external reference frequency signal becomes higher, the voltage supplied from the differential amplifier $6_2$ to the anode of the PIN diode $6_1$ decreases, a current passing through the PIN diode $6_1$ decreases, and the attenuation amount of the PIN diode $6_1$ increases. On the other hand, as the level of the external reference frequency signal becomes lower, the voltage supplied from the differential amplifier $6_2$ to the anode of the PIN diode $6_1$ increases, the current passing through the PIN diode $6_1$ increases and the attenuation amount of the PIN diode $6_1$ decreases. Even when the level of the external reference frequency signal voltage fluctuates, the level of the external reference frequency signal outputted from the cathode of the PIN diode is therefore maintained at a predetermined level. The external reference frequency signal which has passed through the PIN diode $6_1$ is amplified by the output tuned amplifier $6_4$ and outputted from the reference frequency signal output terminal 7 via the output circuit $6_5$. The level of the external reference frequency signal outputted from the reference frequency signal output terminal 7 is set by a divided voltage of the reference voltage adjusting circuit $6_3$.

According to the construction, the detection voltage outputted from the smoothing circuit $5_3$ in the signal switching circuit 5 is supplied to the inversion input terminal of the differential amplifier $6_2$ and the reference voltage is supplied to the non-inversion input terminal. The signal outputted from the reference frequency signal output terminal 7 can be therefore maintained at a predetermined level with a simple construction.

FIG. 2 shows an embodiment in the case where the direction of the PIN diode $6_1$ in the output level adjusting circuit 6 shown in FIG. 1 is changed to the opposite direction. Since the components except for the output level adjusting circuit 6 are similar to those in the embodiment of the invention shown in FIG. 1, their description is omitted here. Either the internal reference frequency signal or the external reference frequency signal is supplied to the terminal 10, the detection voltage is supplied to the terminal 11, and a high voltage is supplied from the high voltage power source to the terminal 12.

In the output level adjusting circuit 6 shown in FIG. 2, in association with the change in the direction of the PIN diode $6_1$ to the opposite direction, a detection voltage is supplied to the non-inversion input terminal (+terminal) of the differential amplifier $6_2$ via the terminal 11 and the reference voltage is supplied to the inversion input terminal (−terminal) The output terminal of the differential amplifier $6_2$ is connected to the ground via the bias resistor $6_8$ and is connected to the cathode of the PIN diode $6_1$ via the inductor $6_6$. A high voltage is applied via the terminal 12 to the anode of the PIN diode $6_1$. The magnitude of the current passing through the PIN diode $6_1$ changes according to a difference between the high voltage and the output voltage of the PIN diode $6_1$ and the attenuation amount changes.

The operation of the output level adjusting circuit 6 shown in FIG. 2 will be described as follows.

When the external reference frequency signal is not supplied to the reference frequency signal switching circuit, the detection voltage is not supplied from the terminal 11, the level of the non-inversion input terminal of the differential amplifier is lowered, the voltage of the output terminal of the differential amplifier $6_2$ decreases, the voltage of the cathode of the PIN diode $6_1$ decreases, and the current passing through the PIN diode $6_1$ increases. Consequently, the attenuation amount of the PIN diode $6_1$ becomes very small. The internal reference frequency signal which has passed through the PIN diode $6_1$ is amplified by the output tuned amplifier $6_4$ and the amplified signal is outputted from the reference frequency signal output terminal 7 via the output circuit $6_5$.

When the external reference frequency signal is supplied to the external reference frequency signal input terminal 1, the detection voltage is supplied to the non-inversion input terminal of the differential amplifier $6_2$ via the terminal 11. Therefore, the higher the level of the external reference frequency signal is, the higher the voltage supplied from the differential amplifier $6_2$ to the cathode of the PIN diode $6_1$ is. The current passing through the PIN diode $6_1$ decreases and the attenuation amount of the PIN diode $6_1$ increases. On the other hand, the lower the level of the external reference frequency signal is, the lower the voltage supplied from the differential amplifier $6_2$ to the cathode of the PIN diode $6_1$ is. The current passing through the PIN diode $6_1$ increases and the attenuation amount of the PIN diode $6_1$ decreases. Consequently, the level of the external reference frequency signal becomes constant.

FIGS. 3 and 4 show another embodiment of the output level adjusting circuit 6 shown in FIGS. 1 and 2. In the example, the PIN diode $6_1$ is provided so as to shunt the input side of the output tuned amplifier $6_4$ to the ground. The direction of the bias current passing through the PIN diode $6_1$ in FIG. 3 and that in FIG. 4 are different from each other.

In the output level adjusting circuit 6 shown in FIG. 3, the anode of the PIN diode $6_1$ is connected to the input side of the output tuned amplifier $6_4$. The anode of the PIN diode $6_1$ is connected to the output terminal of the differential amplifier $6_2$ via the inductor $6_6$ and the cathode of the PIN diode $6_1$ is connected to the ground via the resistor $6_9$ and the capacitor $6_{10}$ which are connected in parallel with each other. The detection voltage is supplied from the terminal 11 to the non-inversion input terminal (+terminal) of the differential amplifier $6_2$ and a reference voltage is supplied to the inversion input terminal (−terminal).

The operation of the output level adjusting circuit 6 shown in FIG. 3 will be described as follows.

When the external reference frequency signal is not supplied to the reference frequency signal switching circuit, the detection voltage is not supplied from the terminal 11, so that the level of the non-inversion input terminal of the differential amplifier $6_2$ is lowered and the voltage of the output terminal of the differential amplifier $6_2$ decreases. Consequently, the voltage of the anode of the PIN diode $6_1$ decreases, the current passing through the PIN diode $6_1$ decreases, and a resistance value of the PIN diode $6_1$ increases. The internal reference frequency signal is not branched to the ground but is amplified by the output tuned amplifier $6_4$ and the amplified signal is outputted from the reference frequency signal output terminal 7 via the output circuit $6_5$.

When the external reference frequency signal is supplied to the external reference frequency signal input terminal 1, the detection voltage is supplied from the terminal 11 to the non-inversion input terminal of the differential amplifier $6_2$. Therefore, the higher the level of the external reference frequency signal is, the higher the voltage supplied from the differential amplifier $6_2$ to the anode of the PIN diode $6_1$ is. The current passing through the PIN diode $6_1$ increases and the resistance value of the PIN diode $6_1$ decreases. The ratio of the external reference frequency signal branched to the ground therefore increases and the ratio of the external reference frequency signal supplied to the output tuned amplifier $6_4$ decreases. On the other hand, the lower the level of the external reference frequency signal is, the lower the voltage supplied from the differential amplifier $6_2$ to the anode of the PIN diode $6_1$ is. The current passing through the PIN diode $6_1$ decreases and the resistance value of the PIN diode $6_1$ increases. Consequently, the ratio of the external reference frequency signal branched to the ground decreases and the ratio of the external reference frequency signal supplied to the output tuned amplifier $6_4$ increases. When the level of the external reference frequency signal voltage fluctuates, consequently, the external reference frequency supplied to the output tuned amplifier $6_4$ is maintained at a predetermined level. Therefore, the level of the external reference frequency signal outputted from the reference frequency signal output terminal 7 becomes constant.

In the output level adjusting circuit 6 shown in FIG. 4, the anode of the PIN diode $6_1$ is connected to the input side of the output tuned amplifier $6_4$. A high voltage is applied via the terminal 12 to the anode of the PIN diode $6_1$, the output terminal of the differential amplifier $6_2$ is connected to the cathode, and the cathode is connected to the ground via the resistor $6_{11}$ and the capacitor $6_{12}$ which are connected in parallel with each other. The detection voltage is supplied from the terminal 11 to the inversion input terminal (−terminal) of the differential amplifier 62 and the reference voltage is supplied to the non-inversion input terminal (+terminal).

The operation of the output level adjusting circuit 6 shown in FIG. 4 will be described as follows.

When the external reference frequency signal is not supplied to the reference frequency signal switching circuit, the detection voltage is not supplied from the terminal 11, the level of the non-inversion input terminal of the differential amplifier $6_2$ is lowered and the voltage of the output terminal of the differential amplifier $6_2$ increases. Consequently, the voltage of the cathode of the PIN diode $6_1$ increases, the current passing through the PIN diode $6_1$ decreases, and a resistance value of the PIN diode $6_1$ increases. Therefore, the internal reference frequency signal is not branched to the ground but is amplified by the output tuned amplifier $6_4$ and the amplified signal is outputted from the reference frequency signal output terminal 7 via the output circuit $6_5$.

When the external reference frequency signal is supplied to the external reference frequency signal input terminal 1, the detection voltage is supplied from the terminal 11 to the inversion input terminal of the differential amplifier $6_2$. Therefore, the higher the level of the external reference frequency signal is, the lower the voltage supplied from the differential amplifier $6_2$ to the cathode of the PIN diode $6_1$ becomes. The current passing through the PIN diode $6_1$ increases and the resistance value of the PIN diode $6_1$ decreases. Consequently, the ratio of the external reference frequency signal branched to the ground increases and the ratio of the external reference frequency signal supplied to the output tuned amplifier $6_4$ decreases. On the other hand, the lower the level of the external reference frequency signal is, the higher the voltage supplied from the differential amplifier $6_2$ to the cathode of the PIN diode $6_1$ becomes. The current passing through the PIN diode $6_1$ decreases and the resistance value of the PIN diode $6_1$ increases. Consequently, the ratio of the external reference frequency signal branched to the ground decreases and the ratio of the external reference frequency signal supplied to the output tuned amplifier $6_4$ increases. Even when the level of the external reference frequency signal voltage fluctuates, therefore, the external reference frequency supplied to the output tuned amplifier $6_4$ is maintained at a predetermined level. Thus, the level of the external reference frequency signal outputted from the reference frequency signal output terminal 7 becomes constant.

As described above, according to the invention, the reference frequency signal switching circuit comprises the signal switching circuit which outputs the internal reference frequency signal from the internal reference frequency oscillator to the output level adjusting circuit when the reference frequency signal is not supplied to the reference frequency signal input terminal and, which outputs the external reference frequency signal to the output level adjusting circuit when the external reference frequency signal is supplied to the reference frequency signal input terminal. The level of the external reference frequency signal outputted to the reference frequency signal output terminal is adjusted to be constant by the output level adjusting circuit irrespective of the input level. Consequently, even when the level of the external reference frequency signal to be supplied fluctuates, the level of the output signal does not fluctuate.

Since the reference frequency signal switching circuit of the invention can change the output level, a signal can be outputted at the level adapted to the transmitter. By setting the level of the internal reference frequency signal outputted from the internal oscillator and the level of the external reference frequency signal supplied from the reference frequency signal input terminal to be almost the same, the reference frequency signal can be outputted from the reference frequency signal output terminal.

In the reference frequency signal switching circuit of the invention, the reference voltage and the detection voltage are compared with each other by the differential amplifier and the attenuation amount of the PIN diode connected in series between the signal switching circuit and the reference frequency signal output terminal is changed. Consequently, by adjusting the reference voltage, the level of the reference frequency signal outputted from the output terminal can be adjusted. When the external reference frequency signal is not supplied, the current passing through the PIN diode increases and the internal reference frequency signal can be outputted almost without any loss to the reference frequency signal output terminal.

In the reference frequency signal switching circuit of the invention, the reference voltage and the detection voltage are compared with each other by the differential amplifier and the attenuation amount of the PIN diode provided between the transfer line connecting the signal switching circuit and the reference frequency signal output terminal and the ground is changed. Consequently, by adjusting the reference voltage, the level of the reference frequency signal outputted from the output terminal can be adjusted. When the external reference frequency signal is not supplied, the current branched from the PIN diode to the ground decreases and the internal reference frequency signal can be outputted almost without any loss to the reference frequency signal output terminal.

In the reference frequency signal switching circuit of the invention, the detection voltage is supplied to the inversion input terminal of the differential amplifier and the reference voltage is supplied to the non-inversion input terminal. According to the output of the differential amplifier, the attenuation amount of the PIN diode connected in series between the signal switching circuit and the reference frequency signal output terminal is changed. The output level adjusting circuit can be therefore realized by a simple circuit.

In the reference frequency signal switching circuit of the invention, the detection voltage is supplied to the non-inversion input terminal of the differential amplifier, the reference voltage is supplied to the inversion input terminal, and the resistance value of the PIN diode provided between the transfer line connecting the signal switching circuit and the reference frequency signal output terminal and the ground is changed according to the output of the differential amplifier. Consequently, the output level adjusting circuit can be realized by a simple circuit.

What is claimed is:

1. A reference frequency signal switching circuit comprising:

an internal oscillator to generate an internal reference frequency signal;

an external reference frequency signal input terminal to which an external reference frequency signal is supplied;

a signal switching circuit;

an output level adjusting circuit; and a reference frequency signal output terminal from which the internal reference frequency signal and the external reference frequency signal are outputted, wherein when the external reference frequency is not supplied, the signal switching circuit outputs the internal reference frequency signal from the internal reference frequency oscillator to the reference frequency signal output terminal via the output level adjusting circuit, when the external reference frequency is supplied, the signal switching circuit outputs the external reference frequency signal to the reference frequency signal output terminal via the output level adjusting circuit, wherein the output level adjusting circuit adjusts an output level of the external reference frequency signal outputted to the reference frequency signal output terminal to be constant irrespective of the level of an input, wherein the output level can be changed, and wherein the output level adjusting circuit comprises a PIN diode and a differential amplifier, the PIN diode is connected in series between the signal switching circuit and the reference frequency signal output terminal, a reference voltage is supplied to one of input terminals of the differential amplifier, a detection voltage proportional to the level of the external reference frequency signal is supplied to another input terminal of the differential amplifier, an output terminal of the differential amplifier is connected to one end of a PIN diode, the magnitude of a current passing through the PIN diode is changed according to an output voltage of the differential amplifier, and the output level is changed according to the reference voltage.

2. The reference frequency signal switching circuit according to claim 1, wherein the reference voltage is supplied to a non-inversion input terminal of the differential amplifier and the detection voltage is supplied to an inversion input terminal.

3. A reference frequency signal switching circuit comprising:

an internal oscillator to generate an internal reference frequency signal;

an external reference frequency signal input terminal to which an external reference frequency signal is supplied;

a signal switching circuit;

an output level adjusting circuit; and a reference frequency signal output terminal from which the internal reference frequency signal and the external reference frequency signal are outputted, wherein when the external reference frequency is not supplied, the signal switching circuit outputs the internal reference frequency signal from the internal reference frequency oscillator to the reference frequency signal output terminal via the output level adjusting circuit, when the external reference frequency is supplied, the signal switching circuit outputs the external reference frequency signal to the reference frequency signal output terminal via the output level adjusting circuit, wherein the output level adjusting circuit adjusts an output level of the external reference frequency signal outputted to the reference frequency signal output terminal to be constant irrespective of the level of an input, wherein the output level can be changed, and wherein the output level adjusting circuit comprises a PIN diode and a differential amplifier, the PIN diode is connected between a transfer line which connects the signal switching circuit and the reference frequency signal output terminal and ground, a reference voltage is supplied to one of input terminals of the differential amplifier, a detection voltage proportional to the level of the external reference frequency signal is supplied to another input terminal of the differential amplifier, an output terminal of the differential amplifier is connected to one end of the PIN diode, a magnitude of a current passing through the PIN diode is changed according to an output voltage of the differential amplifier, and the output level is changed according to the reference voltage.

4. The reference frequency signal switching circuit according to claim 3, wherein the detection voltage is supplied to a non-inversion input terminal of the differential amplifier, and the reference voltage is supplied to an inversion input terminal.

* * * * *